(12) United States Patent
Lee

(10) Patent No.: US 6,972,242 B2
(45) Date of Patent: Dec. 6, 2005

(54) METHODS TO FABRICATE SEMICONDUCTOR DEVICES

(75) Inventor: Date-Gun Lee, Bucheon (KR)

(73) Assignee: DongbuAnam Semiconductor, Inc, Seoul (KR)

( * ) Notice: Subject to any disclaimer, the term of this patent is extended or adjusted under 35 U.S.C. 154(b) by 0 days.

(21) Appl. No.: 10/741,498

(22) Filed: Dec. 19, 2003

(65) Prior Publication Data

US 2004/0132307 A1     Jul. 8, 2004

(30) Foreign Application Priority Data

Dec. 20, 2002   (KR) ...................... 10-2002-0081995

(51) Int. Cl.[7] ............................................. H01L 21/76
(52) U.S. Cl. ...................................... 438/437; 257/647
(58) Field of Search ............................... 438/421–438, 438/691–700, 706, 723, 761, 769–778; 257/632–638, 257/647

(56) References Cited

U.S. PATENT DOCUMENTS

| | | | |
|---|---|---|---|
| 5,721,173 A | 2/1998 | Yano et al. ................. | 438/424 |
| 5,976,951 A | 11/1999 | Huang et al. ................ | 438/435 |
| 5,994,201 A | 11/1999 | Lee ............................. | 438/427 |
| 6,074,927 A | 6/2000 | Kepler et al. ............... | 438/400 |
| 6,180,490 B1 | 1/2001 | Vassiliev et al. ............ | 438/424 |
| 6,524,931 B1 | 2/2003 | Perera ......................... | 438/437 |
| 6,573,551 B1 * | 6/2003 | Kim et al. ................... | 257/306 |
| 6,744,097 B2 * | 6/2004 | Yoo ............................ | 257/321 |
| 6,833,311 B2 * | 12/2004 | Ho et al. ..................... | 438/424 |
| 2004/0183121 A1 * | 9/2004 | Yeh et al. ................... | 257/315 |

* cited by examiner

Primary Examiner—David Nelms
Assistant Examiner—Calvin Lee
(74) Attorney, Agent, or Firm—Hanley, Flight & Zimmerman, LLC

(57) ABSTRACT

Semiconductor device fabrication methods are disclosed. According to one example, a method includes forming a pad oxide layer and a nitride layer sequentially on a silicon substrate, and forming a photoresist pattern for trench formation on the nitride layer; etching the nitride layer and the pad oxide layer using the photoresist pattern as a mask while etching the silicon substrate to form a trench using the nitride layer as an etch stopper; filling the trench by depositing an oxide layer for trench gap filling on entire surface of the silicon substrate; and performing planarization which makes the gap filling oxide exist only in the trench.

6 Claims, 3 Drawing Sheets

--Prior Art--

--Prior Art--

METHODS TO FABRICATE SEMICONDUCTOR DEVICES

TECHNICAL FIELD

The present invention relates to a semiconductor devices and, more particularly, to methods to fabricate semiconductor devices.

BACKGROUND

Shallow trench isolation ("STI") is often used for an isolation structure in semiconductor devices. STI is advantageous for refinement of semiconductor devices because STI confines the size of the field area to the size of the desired trench by forming a trench in a semiconductor substrate and filling the trench with an insulating material.

A fabrication method of a semiconductor device using conventional STI is described with reference to the accompanying drawings. FIGS. 1a and 1b are sectional views showing a conventional fabrication method of a semiconductor device.

First, as shown in FIG. 1a, a pad oxide layer 2 is deposited on a semiconductor substrate 1 and a nitride layer 3 is deposited thereon. A photoresist layer is coated and exposed to form a photoresist pattern (not shown) by removing a portion of the photoresist layer on the area where a trench will be formed, the exposed nitride layer 3, the pad oxide 2, and the substrate 1 are dry-etched using the photoresist pattern as a mask to form a trench T having a desired depth. After the trench is formed, the photoresist pattern is removed, and cleaning is performed.

When the nitride 3 is etched, end point detect ("EPD") is set at the pad oxide layer 2, and the silicon substrate 1 is time-etched using a time that is predetermined by repetitive experimental data, as a standard.

However, the time etching is based on a premise that conditions and/or the state in a chamber are always equal. Therefore, if there is a change of condition and/or state in a chamber due to repetitive use of the chamber, it is impossible to etch the silicon substrate to a desired depth.

In result, as shown in FIG. 1b, a void 5 can be generated during gap filling for STI after trench T is formed in case that the trench is etched deep with low critical value of STI.

If the void 5 is generated in a trench oxide layer 4, it is difficult to planarize the trench oxide layer 4 during chemical mechanical polishing for planarizing the trench oxide layer 4 due to the exposure of the void 5. Moreover, if the void 5 is exposed, polysilicon, which will be deposited for forming electrode in a following step, may enter into the void 5, which causes leakage current. Leakage current might cause malfunction of the device, so leakage current is a fatal disadvantage.

Prior approaches to dealing with a subject matter of etch stop layer include the following U.S. patents.

U.S. Pat. No. 6,524,931 discloses a technique of removing a void from a trench by polishing a prominent portion on a trench plug. U.S. Pat. No. 6,180,490 discloses a method of filling a TEOS oxide layer. U.S. Pat. No. 5,721,173 discloses a method of forming trench using an etch resistant film having different etching selectivity than that of an insulating layer. U.S. Pat. No. 5,976,951 discloses a method of preventing oxide on a trench from losing. U.S. Pat. No. 5,944,201 discloses a method of forming trench having a uniform depth. U.S. Pat. No. 6,074,927 discloses a method of forming wall spacer in a trench, and so forth.

DETAILED DESCRIPTION

Figure 1A:
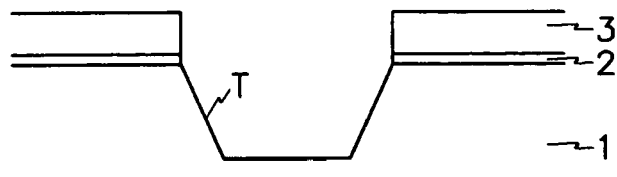
FIGS. 1a and 1b are sectional views showing a conventional fabrication method of a semiconductor device.
Figure 1B:
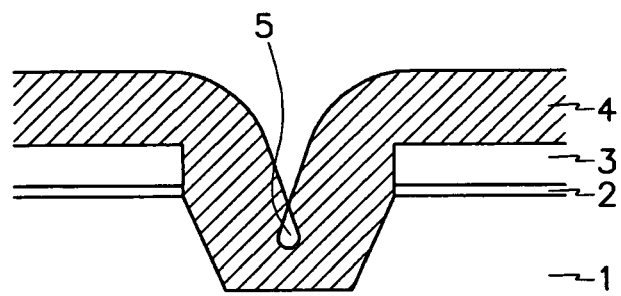

Example methods to fabricate semiconductor devices are fully described herein with reference to the accompanying drawings. The accompanying drawings show merely one example method. However, in the drawings the thickness of layers and regions are exaggerated for clarity.

Figure 2A:
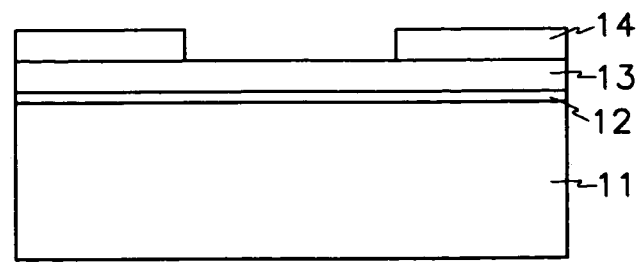
FIGS. 2a–2f are sectional views showing one example of a disclosed method to fabricate a semiconductor device.

FIGS. 2a–2f are sectional views showing one example semiconductor device fabrication method. First, as shown in FIG. 2a, a pad oxide layer 12 and a nitride layer 13 are formed sequentially on a silicon substrate 11, which is a semiconductor substrate. A photoresist layer is coated in a prescribed thickness on the nitride layer 13 during a pattern formation step.

The thickness of the photoresist layer should be determined by considering the thickness to be etched together during subsequent etching process of the nitride layer 13 and the thickness to be etched together during a following process of etching the silicon substrate 11. The thickness of the photoresist that remains after etching the nitride layer 13 should be between roughly 1000 Å–3000 Å.

The photoresist layer is patterned by exposure process using a mask to form a photoresist pattern 14.

Figure 2B:
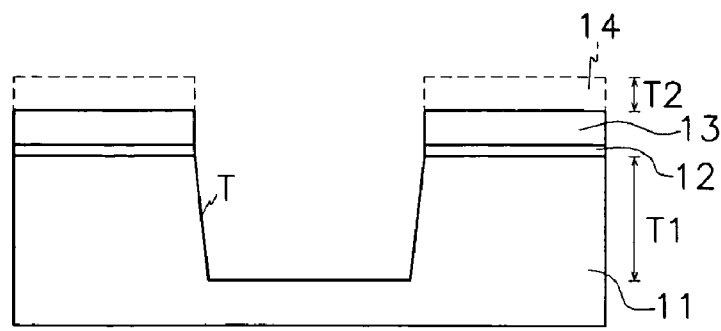

In step of forming trench based on the photoresist pattern 14, as shown in FIG. 2b, the nitride layer 13 and the pad oxide layer 12 are etched using the photoresist pattern 14 as a mask.

Subsequently, the silicon substrate 11 is etched. The remaining photoresist pattern 14 is etched together with the silicon substrate 11 naturally, and the point that the photoresist pattern 14 is completely removed and the nitride layer 13 is exposed is set as an etch stop point.

The etch rate T1 of the silicon substrate 11 is relatively larger than that T2, which is the etch rate of the photoresist pattern 14 during the same time interval when the silicon substrate 11 is etched. Regarding the difference of etch rates, the photoresist pattern is not removed but remains when the nitride layer 13 is etched. For example, when the depth of the trench T formed in the silicon substrate 11 is between about 4000 Å–6000 Å and etching time is between about 60–120 seconds, the etch rate of the photoresist pattern to be etched during the time of etching silicon substrate 11 is about 1000 Å/min–3000 Å/min.

Figure 2C:
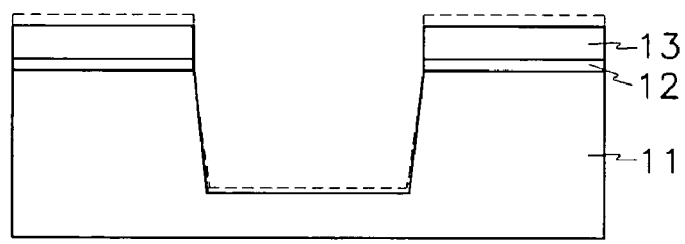

Referring to FIG. 2c, the nitride layer 13 is over-etched a little at the etch stop point in which the photoresist pattern 14 is completely removed.

Figure 2D:
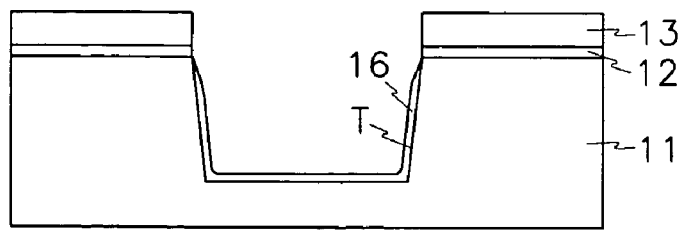

Subsequently, as shown in FIG. 2d, a thermal oxide layer 16 is formed on inner walls of the trench T by a thermal oxidation process. The thermal oxide layer 16 is provided to make it easier for an oxide layer 15, which is to be gap-filled in the trench T in the following step and the silicon substrate 11, to be adhered thereto.

Figure 2E:
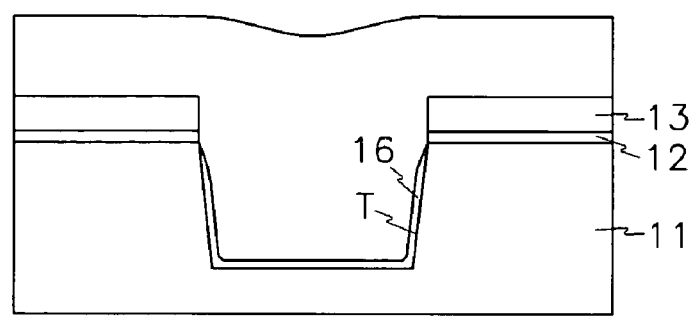

Subsequently, as shown in FIG. 2e, the oxide layer 15 for trench gap filling is deposited on entire surface of the substrate 11 by chemical vapor deposition to fill the trench T substantially completely.

Figure 2F:
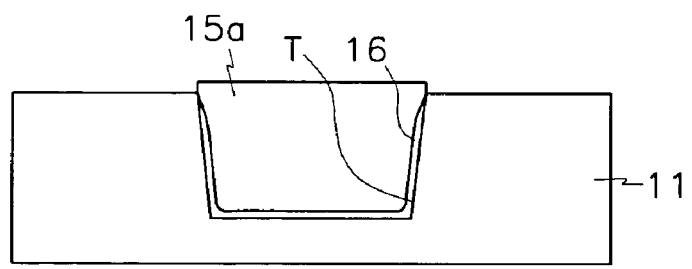

Finally, as shown in FIG. 2f, the gap filling oxide layer 15 is polished by chemical mechanical polishing ("CMP") using the nitride layer 13 as a buffer layer after filling up the trench with the gap filling oxide layer 15. Alternatively or additionally, the gap filling oxide layer 15 can be planarized using an etch-back process. Then, the gap filling oxide layer 15 on the nitride layer 13 is completely removed by CMP and the only gap filling oxide layer 15a that remains is in the trench T.

Because the depth of the trench is controlled precisely by trench etching using the nitride layer as an etch stop layer, voids are not generated even though the planarization process is performed after the trench T is substantially filled with the gap filling oxide layer 15.

After polishing, HF processes, ion implanting processes, etc are performed. Then, the pad oxide layer, which is a buffer oxide layer, is HF processed to expose the silicon substrate 11.

As shown in the above, according to the disclosed example fabrication method, uniform trench depth can be obtained by using the nitride layer as an etch stop point during trench etching, thereby stabilizing fabrication process. Additionally, the amount of photoresist can be reduced by controlling thickness of the photoresist layer to be thinner than that of the conventional process, thereby decreasing fabrication cost.

In addition, a separate step of removing photoresist pattern can be omitted, thereby improving work efficiency.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A fabrication method of a semiconductor device comprising:
    forming a pad oxide layer and a nitride layer sequentially on a silicon substrate, and forming a photoresist pattern for trench formation on the nitride layer;
    etching the nitride layer and the pad oxide layer using the photoresist pattern as a mask while etching the silicon substrate to form a trench using the nitride layer as an etch stopper;
    filling the trench by depositing an oxide layer for trench gap filling on entire surface of the silicon substrate; and
    performing planarization which makes the gap filling oxide exist only in the trench;
    wherein thickness of the photoresist layer is determined to make the photoresist layer be removed simultaneously by etching of the nitride layer the pad oxide layer, and the silicon substrate.

2. A fabrication method as defined by claim 1, wherein the planarization of the gap filling oxide is performed by polishing the gap filling oxide by chemical mechanical polishing using the nitride layer as a buffer layer after filling up the trench with the gap filling oxide.

3. A fabrication method as defined by claim 1, wherein the planarization of the gap filling oxide is performed by etch-back process.

4. A fabrication method as defined by claim 1, wherein thickness of the photoresist which remains on the nitride layer before etching of the silicon substrate is 1000 Å–3000 Å if depth of the trench to be formed is 4000 Å–6000 Å.

5. A fabrication method as defined by claim 1, further comprising over-etching the nitride layer at the etch stop point in which the photoresist pattern is completely etched after the formation of the trench.

6. A fabrication method as defined by claim 5, further comprising forming a thermal oxide layer on inner wall of the trench by thermal oxidation process between the over-etching and the trench filling.

* * * * *